United States Patent [19]  [11]  4,168,536
Joshi et al.  [45]  Sep. 18, 1979

[54] CAPACITOR MEMORY WITH AN AMPLIFIED CELL SIGNAL

[75] Inventors: Madhukar L. Joshi, Essex Junction; Wilbur D. Pricer, Burlington, both of Vt.

[73] Assignee: International Business Machines Corporation, Armonk, N.Y.

[21] Appl. No.: 811,812

[22] Filed: Jun. 30, 1977

[51] Int. Cl.² ............................................. G11C 11/24
[52] U.S. Cl. ..................................................... 365/149
[58] Field of Search ......................................... 365/149

[56] References Cited
U.S. PATENT DOCUMENTS
3,652,914  3/1972  Krausser .............................. 365/149

FOREIGN PATENT DOCUMENTS
2456893 12/1976 Fed. Rep. of Germany ........... 365/149

Primary Examiner—Stuart N. Hecker
Attorney, Agent, or Firm—Stephen J. Limanek

[57] ABSTRACT

A memory is produced which has a series circuit including charge storage means, an impedance and switching means and an amplifier having an input connected to the series circuit at a point between the charge storage means and the impedance and an output coupled to a bit/sense line. The switching means is controlled by a pulse from a word line. The series circuit interconnects the bit/sense line and a point of reference potential. In a preferred embodiment, the switching means is a first field effect transistor having its gate electrode connected to the word line and the amplifier is a second field effect transistor having its gate electrode connected to the series circuit at a point between the charge storage means and the impedance and having one of its current carrying electrodes coupled to the bit/sense line and its other current carrying electrode coupled to a point of reference potential.

18 Claims, 16 Drawing Figures

CAPACITOR MEMORY WITH AN AMPLIFIED CELL SIGNAL

BACKGROUND OF THE INVENTION

1. Field of the Invention

This invention relates to integrated semiconductor memory circuits and more particularly to memory circuits which employ a capacitor for storing binary digits of information.

2. Description of the Prior Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line. In also commonly assigned U.S. Pat. Nos. 3,811,076, by W. M. Smith, and 3,841,926 by R. H. Garnache and W. M. Smith, both filed Jan. 2, 1973, there is disclosed a one device field effect transistor memory cell of the type described in the above identified Dennard patent which is fabricated to a very small size by utilizing a layer of doped polycrystalline silicon separated by a dielectric medium disposed on the surface of a semiconductor substrate for forming a storage capacitor.

In commonly assigned U.S. Pat. No. 3,979,734, filed on June 16, 1975, by W. D. Pricer and J. E. Selleck, there is described a fast memory array made of small cells which employ storage capacitors and bipolar transistors. In this latter array, which is word organized, each storage capacitor of these cells has simply one capacitor terminal connected to a separate bit/sense line while selected cells forming a word are simultaneously accessed by utilizing a word pulse for coupling to the other terminal of the storage capacitors of that word. The bipolar transistors require a more complex fabrication process than do the field effect transistors.

Memory arrays utilizing cells which employ two active devices and provide a preamplified signal to a bit/sense line are also known but when such known cells are used they produce a very complex memory array generally requiring a large semiconductor surface area. A two device memory cell described in U.S. Pat. No. 3,882,472, filed May 30, 1974, requires two lines to address the word and means must be provided to keep track of whether the data stored in the cells is true or inverted. Another two device memory cell is described in U.S. Pat. No. 3,614,749, filed June 2, 1969. In this latter patent two word lines and two bit lines are required, as well as area-consuming contacts between a gate electrode of one transistor and a current-carrying electrode of the second transistor. A third memory cell utilizing two devices is taught in commonly assigned U.S. Pat. No. 3,919,569, filed Dec. 29, 1972. The cell described in this latter patent uses complementary transistors and requires two bit lines.

The three device memory cell, such as disclosed in commonly assigned U.S. Pat. No. 3,585,613, filed Aug. 27, 1969, also provides a preamplified signal to a bit/sense line but the three devices consume a substantial amount of surface area of the semiconductor substrate and require two word lines.

SUMMARY OF THE INVENTION

It is an object of this invention to provide an improved memory cell having a small area and a larger than normal cell signal.

It is another object of this invention to provide an improved memory array which is simple to fabricate and has high density and increased speed.

It is still another object of this invention to provide a high density integrated memory array having cells which produce amplified signals in very small areas.

It is yet another object of this invention to provide an improved high density memory array having dynamic cells, each of which has two active devices, and a single word line and a single bit/sense line, and utilizing support circuits formed on a substantially reduced area of a semiconductor chip.

Yet a further object of this invention is to provide an improved memory array with a single fabrication process which utilizes sense amplifiers requiring only a small area and a simple design to provide rapid operation.

A further object of this invention is to provide an improved memory array utilizing dynamic cells which does not require the bit/sense line to be precharged to the midpoint between two predetermined high and low voltages indicative of binary information.

Still another object of this invention is to provide an improved high density memory array having cells producing signals which are a function of the RC time constant of a resistor and a storage capacitor of the cell and which are preamplified prior to being applied to a bit/sense line of the array.

In accordance with the teaching of this invention, a memory is produced which includes a serial arrangement of a charge storage element, an impedance and a switch interconnecting a bit/sense line and a point of reference potential, with an amplifier having an input coupled to the serial arrangement at a point between the charge storage element and the impedance and an output coupled to the bit/sense line. The switch is controlled by a pulse from a word line. In a preferred embodiment of the invention, the charge storage element is a capacitor, the impedance is a resistor and the switch and the amplifier are first and second field effect transistors, respectively. When employing integrated semiconductor technology, the resistor is preferably fabricated above the surface of the semiconductor substrate, and therefore, it does not increase the cell surface area.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
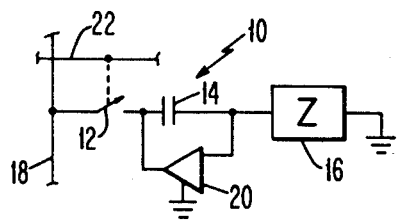
FIG. 1 illustrates one embodiment of the memory cell circuit of the present invention.

Referring to FIG. 1 in more detail, there is shown one embodiment of the memory cell circuit of the present invention. The cell circuit includes a series circuit 10 having switch means 12, a charge storage means in the form of a capacitor 14 and an impedance 16. The series circuit 10 is connected between a bit/sense line 18 and a reference potential, such as ground. An amplifier 20 has its input connected to the common point between the storage capacitor 14 and the impedance 16. The output of the amplifier 20 is connected to the common point between the switch means 12 and the storage capacitor 14. A selection or word line 22 is connected to the switch means 12 to control its operation.

In the operation of the memory cell circuit of FIG. 1, information is written into the storage capacitor 14 by precharging the bit/sense line 18 to a voltage +VH when storing, e.g., a 1 bit of information and closing switch means 12 by applying a pulse from the word line 22 to switch means 12 to charge up storage capacitor 14. To store a 0 bit of information in the cell circuit, the bit/sense line 18 is precharged to a low voltage, for example, ground, prior to closing the switch means 12. Since the bit/sense line 18 is at ground potential, the storage capacitor 14 will not be charged.

In order to read information from the cell circuit, a voltage +VH is applied to bit/sense line 18 and a pulse from word line 22 closes switch means 12. If the storage capacitor 14 has a 1 stored therein, that is, the capacitor 14 is charged, the bit/sense line voltage remains at substantially the +VH level and the amplifier 20 remains inoperative. When the capacitor 14 is not charged, that is, indicating a 0 bit of information stored in the cell, the voltage +VH on bit/sense line 18 charges capacitor 14 and develops a voltage across the impedance 16 which is applied to the input of amplifier 20 turning on amplifier 20 and thus discharging the bit/sense line through switch means 12 and amplifier 20 to ground. The time of the transient voltage across impedance 16 is determined by the RC time constant of the series circuit 10. If the voltage +VH on bit/sense line 18 is, for example, 10 volts, a substantial signal of from 1 to 2 volts can be developed on the bit/sense line 18 with the use of the amplifier 20. A simple latch circuit sense amplifier, which may be coupled to the bit/sense line 18, as described hereinafter in connection with the array illustrated in FIG. 10 of the drawing, can then amplify the transient down to 0 volts or ground. Since the signal developed in the cell is large, the operation of the sense amplifier is rapid and less stringent requirements can be placed on this amplifier. Because the bit/sense line voltage began at +VH, no subsequent source follower pull up is required to replenish the lost charge as is frequently necessary in connection with the use of sense amplifiers for other type cell circuits.

Figure 2:
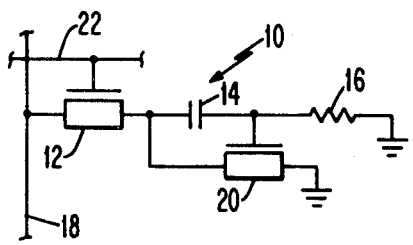
FIG. 2 illustrates in more circuit detail the embodiment of the invention shown in FIG. 1.

The cell circuit illustrated in FIG. 2 of the drawing is similar to the circuit of FIG. 1 but is illustrated in more detail with field effect transistors and with the impedance 16 shown as a resistor 16. Throughout the drawings, similar elements are indicated by similar reference numbers. The cell circuit in FIG. 2 includes a series circuit 10 having a first field effect transistor 12, the storage capacitor 14 and the resistor 16. The series circuit 10 is connected between the bit/sense line 18 and a point of reference potential, indicated as ground. A second field effect transistor 20 is connected from the common point between the first field effect transistor 12 and the storage capacitor 14 and the point reference potential, ground. The gate electrode of the first field effect transistor 12 is connected to the word line 22 and the gate electrode of the second field effect transistor 20 is connected to the common point between the storage capacitor 14 and the resistor 16.

In the operation of the circuit of FIG. 2, in order to write a 1 bit of information into the cell, the bit/sense line 18 is precharged to the voltage +VH and a pulse is applied to the gate electrode of the first transistor 12 from the word line 22 to turn on the first transistor 12, which charges capacitor 14 to a voltage +VH minus the threshold voltage VT of the first transistor 12. In order to write a 0 bit of information into the cell circuit, the bit/sense line 18 is placed at substantially ground potential and the first transistor 12 is turned on by a pulse from the word line 22. Since the bit/sense line 18 is at ground potential, the capacitor 14 does not receive a charge. Accordingly, charge on the storage capacitor 14 equal to +VH−VT represents a 1 bit of binary information and no charge on capacitor 14 represents a 0 bit of information.

In order to read the information stored on capacitor 14, the bit/sense line 18 is charged to the voltage +VH and a pulse from word line 22 is applied to the gate electrode of the first transistor 12 to render transistor 12 conductive. If a 1 bit of information is stored on capacitor 14, the voltage on bit/sense line 18 remains constant. However, if a 0 bit of information is stored on capacitor 14, capacitor 14 will tend to become charged to the voltage +VH−VT producing a transient voltage across resistor 16. This transient voltage is applied to the gate electrode of the second field effect transistor 20 which turns on discharging the bit/sense line through the first and second transistors to ground. The transient voltage is amplified by transistor 20 for a time determined by the RC time constant of the storage capacitor 14 and the resistor 16 and by the Miller effect of the second transistor 20. When the bit/sense line voltage +VH has a magnitude of approximately 10 volts, a substantial signal of from 1 to 2 volts is developed on the bit/sense line 18 by the use of the second field effect transistor 20. It should be noted that the second transistor 20 provides a threshold that discriminates against leakage on the storage capacitor 14 up to a threshold voltage. As will be indicated hereinbelow in more detail, if a shorter time constant is desired during the writing operation, the source of the second transistor 20 may be pulsed to a positive voltage.

Figure 3:
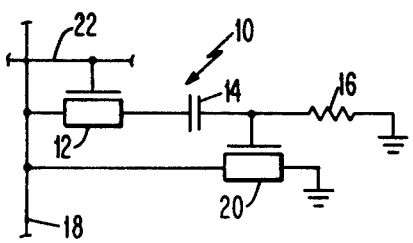
FIG. 3 illustrates an embodiment of the memory cell circuit of this invention which operates faster than the cell shown in FIG. 2.

In the memory cell circuit of FIG. 3, the series circuit 10 is similar to the series circuit 10 illustrated in the cell circuit of FIG. 2, however, cell circuit of FIG. 3 differs from the cell circuit of FIG. 2 in that the second transistor 20 is connected directly to the bit/sense line 18 instead of being connected to the bit/sense line 18 through the first transistor 12. The circuit of FIG. 3 operates faster than the circuit illustrated in FIG. 2 of the drawing since the bit/sense line 18 is discharged to ground through only one transistor, that is, the second transistor 20 instead of through two serially connected transistors, that is, transistors 12 and 20, as shown in FIG. 3 of the drawing. Although the circuit of FIG. 3 is faster than the circuit of FIG. 2, in order to fabricate the memory cell circuit of FIG. 3, a larger surface area on the semiconductor substrate is required since a separate connection from the bit/sense line must be made directly to a current-carrying electrode of the second transistor 20, as will be discussed in more detail hereinbelow. The operation of the circuit of FIG. 3 is similar to that described hereinabove in connection with the operation of the circuit of FIG. 2.

Figure 4:
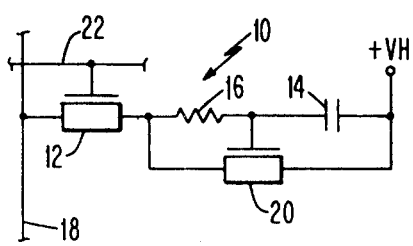
FIG. 4 illustrates yet another embodiment of the memory cell circuit of this invention wherein a precharge bit/sense line reference voltage is at a lower voltage than the cell full charging voltage.

In the cell circuit of FIG. 4, the series circuit 10 is connected between the bit/sense line 18 and a point of reference potential which is at a voltage +VH. The storage capacitor 14 is located between the reference potential +VH and the resistor 16, with the resistor 16 being interposed between the first field effect transistor 12 and the storage capacitor 14. The second field effect transistor 20 is connected from the common point between the first transistor 12 and the resistor 16 and the point of reference potential +VH. The gate electrode of the first transistor 12 is again connected to the word line 22 and the gate electrode of the second transistor is again connected to the common point between the resistor 16 and the storage capacitor 14.

In the operation of the circuit of FIG. 4, in order to write a 1 bit of information into the cell circuit, the bit/sense line 18 is precharged to a voltage +VH which prevents capacitor 14 from being charged even when a pulse from the word line 22 turns on transistor 12 since substantially equal voltages are applied to both sides of capacitor 14. In order to store a 0 bit of information on the storage capacitor 14, the bit/sense line is lowered to ground potential and the first transistor 12 is turned on by a pulse from the word line 22 causing storage capacitor 14 to be charged to the voltage +VH minus the threshold voltage VT of the first transistor 12.

During the read operation, the bit/sense line 18 is placed at ground potential or driven to a low voltage and the first transistor 12 is turned on by a pulse from word line 22. If the capacitor 14 has been charged indicating a 0 bit of information stored thereon, the voltage on bit/sense line 18 remains at ground potential. However, if a 1 bit of information had been stored on capacitor 14, that is, capacitor 14 had not been charged, then a transient voltage is developed across resistor 16 which turns on the second transistor 20 to charge the bit/sense line 18 to a value substantially above ground potential through first and second transistors 12 and 20 from the +VH reference potential.

Figure 5:
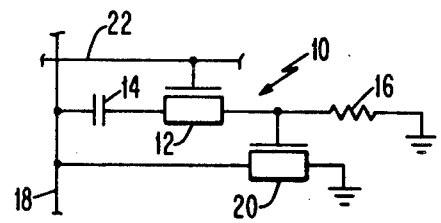
FIG. 5 illustrates a further embodiment of the memory cell circuit of this invention wherein the storage capacitor is directly connected to a bit/sense line.

In FIG. 5 the series circuit 10 of the memory cell circuit has its storage capacitor 14 connected between the bit/sense line 18 and the first transistor 12 and the resistor 16 is connected between the first transistor 12 and ground potential. The second transistor 20 is connected between ground potential and the bit/sense line 18. The gate electrode of the first transistor is again connected to the word line 22 with the gate electrode of the second transistor 20 being connected to the common point between the first transistor 12 and the resistor 16. This circuit operates in a manner very similar to the operation of the circuit illustrated in FIG. 3. However, the fabrication of this circuit differs somewhat from the fabrication of the circuit of FIG. 3 and will be described hereinbelow in more detail.

Figure 6:
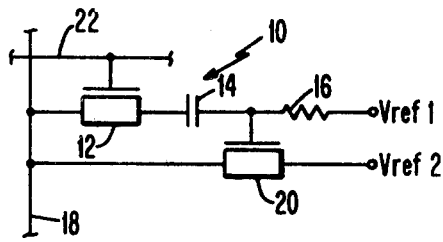
FIG. 6 illustrates still a further embodiment of the memory cell circuit of the present invention which is similar to the circuit illustrated in FIG. 3 but which differs therefrom by having points of differing reference potential.

The circuit of FIG. 6 is similar to the circuit of FIG. 3 with the exception that voltages Vref1 and Vref2 are substituted for the points of ground potential indicated in FIG. 3. By applying the voltages Vref1 and Vref2 which may differ from ground by up to 1 or 2 volts, adjustments may be made for the parameters in each of the field effect transistors 12 and 20, such as adjustments in the threshold voltage of these transistors. The operation of the circuit of FIG. 6 is similar to that described hereinabove in connection with the operation of FIG. 3.

Figure 7:
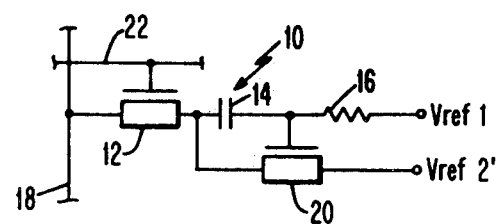
FIG. 7 illustrates still another embodiment of the memory cell circuit of the present invention which is patterned after the circuit shown in FIG. 2 but which differs therefrom by having points of differing reference potential including a reference potential in pulsed form.

The cell circuit illustrated in FIG. 7 is similar to the cell circuit illustrated in FIG. 2 of the drawing, except that reference potentials Vref1 and Vref2' are substituted for the two points of ground potential indicated in FIG. 2. The voltage at the terminal Vref2' is preferably a pulse voltage, having a magnitude as high as +VH, which is applied to the terminal Vref2' during the write operation in order to insure that current does not pass through the second transistor 20. Accordingly, during the write operation all the charge from the bit/sense line 18 is applied to the storage capacitor 14 when a 1 bit of information is being written into the cell circuit. The circuit of FIG. 7 saves energy and also operates faster than the circuit illustrated in FIG. 2 of the drawing.

The memory cell circuits illustrated in FIGS. 1 through 7 may be fabricated in a manner somewhat similar to the fabrication of the memory cells disclosed in, for example, commonly assigned U.S. Patent Application having Ser. No. 793,217, now U.S. Pat. No. 4,123,300, filed May 2, 1977, by M. L. Joshi, P. F. Landler and R. Silverman. The process for making the cells, particularly the cell circuits illustrated in FIGS. 2 and 7 of the drawing, is indicated in FIGS. 8A through 8F of the drawing, as shown in cross section.

Figure 8A:
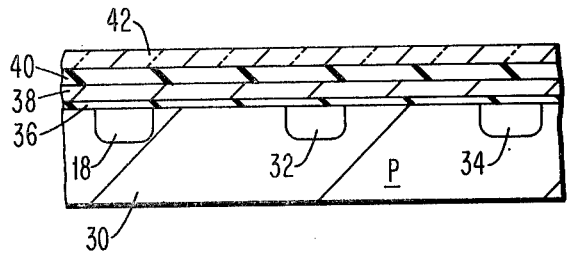
FIGS. 8A through 8F illustrate in cross section the cell circuit structure of the present invention in integrated form during various processing steps, particularly for circuits illustrated in FIGS. 2 and 7 of the drawing.

As indicated in FIG. 8A, a substrate 30 preferably made of P-type silicon has formed therein three N+ diffusion regions 18, 32 and 34. The N+ diffusion regions 18, 32 and 34 may be produced in a known manner by using doped oxide strips and rectangular films. The strips and films may be produced by forming a layer of doped oxide on the surface of the substrate 10 and then utilizing an appropriate masking technique to define the desired geometries in the form of the desired strips and rectangular films. The regions 18 and 34 are produced by the use of elongated doped oxide strips shared by other cell circuits (not shown), whereas the region 32 is produced by the use of discrete spots of rectangular film. The dopant from the strips and films is driven into the substrate 10 to form the diffused regions 18, 32 and 34. The doped strips and films are then etched away to provide a clean silicon substrate surface. A thin layer of dielectric material, preferably silicon dioxide 36, having a thickness of approximately 450

Figure 8B:
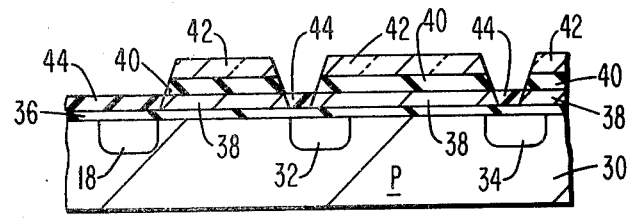
Figure 8C:
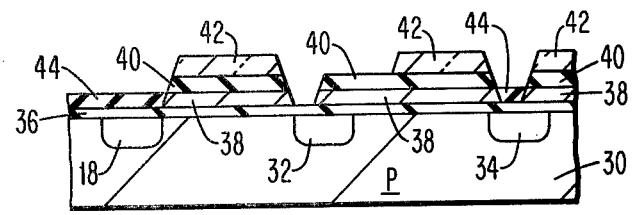
Figure 8D:
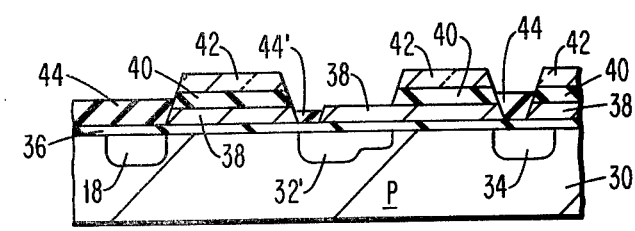
Figure 8E:
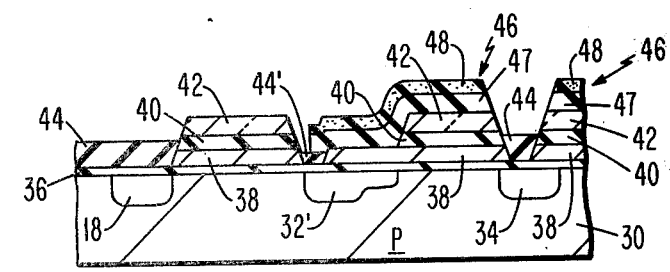
Figure 8F:
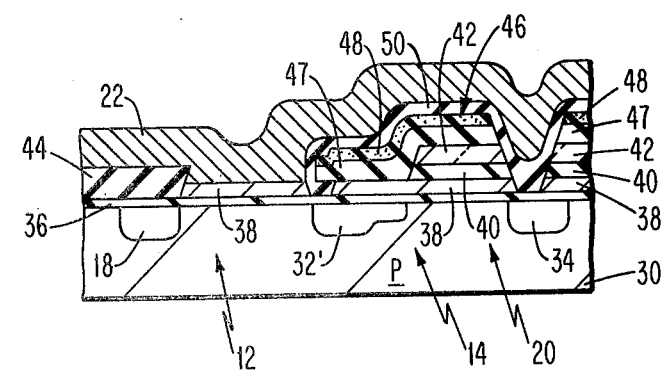

Angstroms, is deposited on the clean surface of the substrate 10. The thin silicon dioxide layer 36 is formed on the surface of the substrate 10 by any well known techniques, such as thermal oxidation. A first layer of conductive polycrystalline silicon or polysilicon 38 is deposited on the silicon dioxide layer 36. Polysilicon layer 38 may be deposited by decomposition of silane in the presence of a boron containing gas, such as Diborane, at a temperature of about 900° C. A layer of silicon nitride 40 is deposited over the first layer of polysilicon 38 and a second layer of silicon dioxide 42 is deposited over the silicon nitride layer 40, as shown in FIG. 8A. The second layer of silicon dioxide 42 may be deposited by employing well known pyrolytic deposition techniques. By again employing suitable masking techniques the silicon nitride layer 40 and the second layer of silicon dioxide 42 are etched away except for portions disposed between the diffused regions 18 and 32 and regions 32 and 34, as indicated in FIG. 8B. The exposed portions of the first layer of polysilicon 38 are oxidized to form an insulator 44, as indicated in FIG. 8B. A section of the second silicon dioxide layer 42 disposed over the N+ diffusion region 32 as well as the section of the insulator 44 disposed over the N+ diffusion 32 are now etched away, as indicated in FIG. 8C, and the edges of the first layer of polysilicon 38 disposed over the N+ diffusion are oxidized to form a layer of insulation 44', as indicated in FIG. 8D. Utilizing a known dip etch process, the exposed section of silicon nitride layer 40 over the N+ diffusion region 32 is also etched away, as indicated in FIG. 8D. By employing well known ion implanting techniques through the first layer of polysilicon 38, the N+ diffusion 32 is extended to form the N+ diffusion 32', as shown in FIG. 8D. A second layer of polycrystalline silicon or polysilicon 46 is deposited over the structure illustrated in FIG. 8D with the lower portion 47 being resisitive and the top portion 48 of this layer 46 being doped with arsenic to provide a thin conductive region, as indicated in FIG. 8E. The resistive lower portion 47 of the second polysilicon layer 46 may be, for example, greater than 1,000 ohm-centimeters. By using suitable masking techniques, the second layer of polysilicon 46 is etched to produce the resistor 46 indicated in FIG. 8E of the drawing. The high resistivity polysilicon layer 46 and particularly the resistive lower portion 47 can be produced by any known technique, e.g., as described in *Journal of Non-Crystalline Solids*, 11 (1922) pages 219-234 and 17 (1975) pages 409-427. The second silicon dioxide layer 42 disposed between N+ diffusion regions 18 and 32' is etched away and then the second layer of polysilicon 46 is oxidized to form an insulating layer 50, as indicated in FIG. 8F. The silicon nitride layer 40 over the first polysilicon layer 38 is removed by the dip etch process to provide a clean surface on the polysilicon layer 38. A metal word line 22 which is preferably made of copper-doped aluminum is formed on the structure so as to be in contact with the first layer of polysilicon 38 in the region between the N+ diffusions 18 and 32'. The word line 22 is formed by using suitable etching techniques.

It can be seen that the transistor 12 of FIG. 2 or FIG. 7 is formed in the structure of FIG. 8F by the N+ diffusions 18 and 32' with the gate electrode being the segment of the first layer of polysilicon 38 disposed above the thin silicon dioxide layer 36 between the N+ diffusions 18 and 32'. The N+ diffusion 18 also serves as the bit/sense line of the cell circuit. The transistor 20 of the circuit of FIG. 2 or FIG. 7 is formed by the N+ diffusions 32' and 34 with its gate electrode being the segment of the first layer of polysilicon 38 located between the N+ diffusions 32' and 34. The capacitor 14 of FIGS. 2 or 7 is formed by the N+ diffusion region 32', the segment of the first layer of conductive polysilicon 38 disposed over the N+ diffusion 32' and the first silicon dioxide layer 36 interposed between N+ diffusion 32' and the first layer of polysilicon 38. The resistor 16 of the circuit of FIGS. 2 or 7 is shown in the structure of FIG. 8F as the resistive portion 47 of the second layer of polysilicon 46. The resistive portion 47 is in contact with the first layer of polysilicon 38 and in contact with a point of ground potential, not shown in FIG. 8F. The relationship of the structure of FIG. 8F with respect to the circuit of FIG. 2 and with respect to the circuit of FIG. 7 is similar with the exception that for the circuit of FIG. 7 the resistor portion 47 is connected at one end to a reference voltage Vref1 and the N+ diffusion region 34 is connected to a potential of Vref2' rather than to a ground potential in each instance, as indicated in FIG. 2.

The process for making the circuits in FIGS. 3 and 6 is similar to the process described hereinabove in connection with the fabrication of the circuits of FIGS. 2 and 7 except that a diffusion must be provided from the bit/sense line 18 directly to the transistor 20. The formation of this diffusion require space on the surface of the semiconductor substrate 30 so the area of the cell circuit is larger than that of the circuit illustrated in FIG. 2, however, as stated hereinabove, this circuit is faster than that of FIG. 2.

Figure 9:
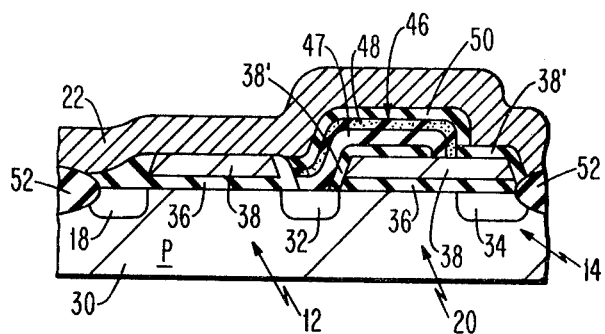
FIG. 9 illustrates in cross section the completed cell circuit structure of the circuit shown in FIG. 4.

The process for making the cell circuit of FIG. 4 differs from that of the circuits of FIGS. 2 and 7 primarily in that the resistive lower portion 47 of the second polysilicon layer 46 must be produced so as to interconnect the N+ diffusion 32 and the gate electrode 38 of the second transistor 20 and the storage capacitor 14 must be provided between the gate electrode 38 of the second transistor 20 and the N+ diffusion 34. A cross section of the structure for the memory cell circuit of FIG. 4 is illustrated in FIG. 9 of the drawing, where elements or layers similar to those shown in FIG. 8F are identified by similar reference numbers. It can be seen from FIG. 9 that transistors 12 and 20 are formed much in the same manner as in the structure of FIG. 8F. The resistor 16 of FIG. 4 is formed by the resistive lower portion 47 of the second polysilicon layer 46 with contacts being made at the diffusion 32 and at the gate electrode 38 of the transistor 20. The storage capacitor 14 of FIG. 4 is indicated by N+ diffusion 34, thin silicon dielectric 36 and the first polysilicon layer 38. It can be seen that an insulation layer 38' isolates a portion of the resistive lower portion 47 of the second polysilicon layer 46 from the first polysilicon layer 38 and a portion of the word line 22 from the first polysilicon layer 38. Furthermore, whereas in FIG. 8F a field shield is indicated at 44 as an insulation located above the thin dielectric layer 36, in FIG. 9 isolation between cells is indicated as being accomplished by recessed oxide regions 52.

To make the integrated circuit structure for the cell circuit of FIG. 5, a polysilicon line may be disposed over the thin silicon dioxide layer 36 to form together with the N+ diffusion 18 the capacitor 14. In this instance the polysilicon line serves as the bit/sense line of the cell circuit. The resistor 16 of the cell circuit of FIG. 5 is formed by the resistive lower portion 47 of the second polysilicon layer 46 being connected at one end to the N+ diffusion 32 as described hereinabove in connection with the structure of FIG. 9 and at the other end to a point of ground potential. A contact would be required between the polysilicon line and a diffusion which goes directly to the second transistor 20. A second contact would have to be formed between a current-carrying electrode of the first transistor 12 and the gate electrode of the second transistor 20.

Figure 10:
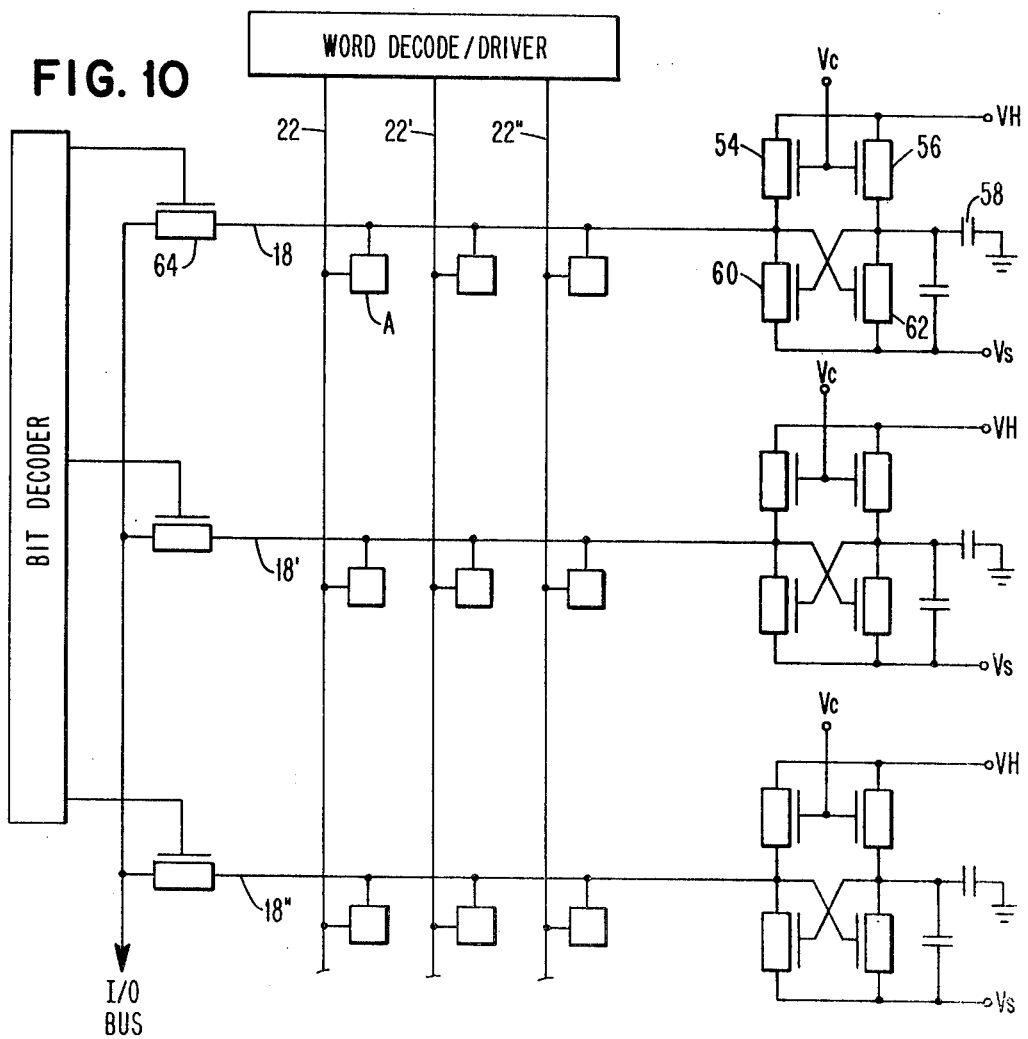
FIG. 10 illustrates a memory array in which most of the cells shown in FIGS. 1 through 7 may be utilized.
Figure 11:
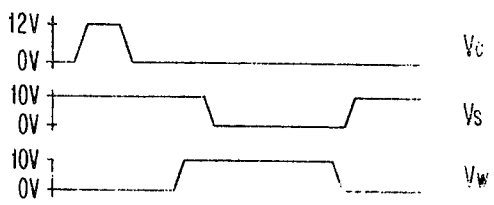
FIG. 11 is a pulse program which may be used to operate the memory array shown in FIG. 10.

In FIG. 10 there is illustrated a memory array which may utilize most of the cell circuits described hereinabove. The array requires only very simple latch circuits coupled to the bit/sense lines which are operated by the pulse program indicated in FIG. 11 of the drawing. Although three bit/sense lines 18, 18' and 18" and three word lines 22, 22' and 22" are illustrated, the operation of the array will be described only in connection with the operation of bit/sense line 18 and word line 22 since the operation of the array with respect to the other combinations of lines is similar.

To restore information stored in cell circuit A which is coupled to bit/sense line 18 and word line 22, the voltage pulse Vc is applied to the gate electrodes of first and second transistors 54 and 56 to charge bit/sense line 18 and capacitor 58 to +VH, with the voltage Vs being applied to the sources of third and fourth transistors 60 and 62 to maintain them in an off condition. When the word pulse Vw is applied to line 22, the +VH voltage on bit/sense line 18 will remain substantially constant if a 1 bit of information is stored in cell circuit A, with charge from the bit/sense line 18 replacing only any charge leakage that may have occurred in cell circuit A. With the bit/sense line voltage remaining at its high level, transistor 62 will be turned on insuring that transistor 60 remains off. If a 0 bit of information is stored in cell circuit A, the bit/sense line voltage will drop below +VH and transistor 62 will remain off with transistor 60 turning on due to the +VH voltage across capacitor 58. With transistor 60 on, the bit/sense line voltage drops to ground since the voltage Vs is now at ground. Any charge accumulated in cell circuit A will also be discharged to ground.

To write information into cell circuit A, the bit decoder must turn on transistor 64. If a 1 bit of information is to be stored in cell circuit A, the I/O Bus will have applied thereto a voltage +VH from which charge will be applied to the storage capacitor of cell circuit A when the word pulse is applied to word line 22. If a 0 bit of information is to be stored in the cell circuit A, the I/O Bus will have applied thereto zero or ground potential which will discharge the bit/sense line 18 and thus also any voltage which may have been stored on the storage capacitor of cell circuit A.

It can be seen that the memory cell circuits of the present invention can be utilized in a memory array which requires only very simple latch circuits that operate very rapidly since the signals applied to the latch circuits are relatively strong compared with the signals produced by normal or known dynamic cell circuits.

Although the resistor 16 has been shown to be made of a resistive polysilicon material, it should be noted that the resistor can be made in the crystalline silicon substrate 30 but two contacts will be required.

It should also be noted that in accordance with the invention, a cell circuit is provided in a very small area of semiconductor surface wherein charge is used to activate an amplifier before the charge is transferred to the bit/sense line.

It should be further noted, that although field effect transistors are disclosed in the embodiment, if desired, bipolar transistors may be used.

While the invention has been particularly shown and described with reference to preferred embodiments thereof, it will be understood by those skilled in the art that various changes in form and details may be made therein without departing from the spirit and scope of the invention.

What is claimed is:

1. A memory cell circuit comprising
   a data line,
   a series circuit including interconnected switching means, charge storage means and a resistor coupled between said data line and a point of reference potential,
   an amplifier having an input connected to said resistor of said series circuit at a point between said resistor and said charge storage means and an output coupled to said data line, and
   a selection line coupled so as to operate said switching means.

2. A memory cell circuit as set forth in claim 1 wherein said switching means and said amplifier are first and second field effect transistors, respectively.

3. A memory cell circuit as set forth in claim 1 wherein the output of said amplifier is coupled to said data line through said switching means.

4. A memory cell circuit as set forth in claim 1 wherein the output of said amplifier is connected directly to said data line.

5. A memory cell circuit as set forth in claim 1 wherein said charge storage means is interposed between said switching means and said resistor.

6. A memory cell circuit as set forth in claim 5 wherein said amplifier is coupled between said data line and a second point of reference potential having a magnitude greater than zero volts.

7. A memory cell circuit as set forth in claim 6 wherein the point of reference potential to which said series circuit is coupled and the point of reference potential to which said amplifier is coupled have differing potentials.

8. A memory cell circuit as set forth in claim 1 wherein said point of reference potential has a voltage magnitude capable of providing a full charge to said charge storage means.

9. A memory cell circuit as set forth in claim 8 wherein said charge storage means is interposed between said point of reference potential and said resistor.

10. A memory cell circuit as set forth in claim 9 wherein said charge storage means is a capacitor, and said switching means and said amplifier are first and second field effect transistors.

11. A memory cell circuit as set forth in claim 10 wherein the output of said amplifier is connected to the common point between said first transistor and said resistor and the input of said amplifier is connected to the common point between said resistor and said capacitor.

12. A memory cell circuit a set forth in claim 1 wherein said charge storage means is disposed between said switching means and said data line.

13. A memory cell circuit as set forth in claim 12 wherein the output of said amplifier is connected directly to said data line.

14. A memory cell circuit comprising
   a bit/sense line, a series circuit including charge storage means and resistive means, means for selectively coupling said series circuit to said bit/sense line, and means having an input connected to said resistive means of said series circuit at a point between said resistive means and said charge storage means for amplifying the signal on said charge storage means and having an output coupled to said bit/sense line.

15. A memory cell circuit as set forth in claim 14 wherein said selectively coupling means includes a transistor and a word line coupled to a control electrode of said transistor.

16. A memory cell circuit as set forth in claim 14 wherein said charge storage means is a capacitor.

17. A memory cell circuit as set forth in claim 16 wherein said means for amplifying includes a field effect transistor having a gate electrode coupled to said charge storage means at the common point between said capacitor and said resistive means.

18. A memory cell circuit as set forth in claim 14 wherein said means for amplifying includes a field effect transistor having a gate electrode coupled to said resistive means.

* * * * *